United States Patent [19]

Barnes et al.

[11] Patent Number: 5,793,162
[45] Date of Patent: Aug. 11, 1998

[54] APPARATUS FOR CONTROLLING MATCHING NETWORK OF A VACUUM PLASMA PROCESSOR AND MEMORY FOR SAME

[75] Inventors: Michael S. Barnes, San Francisco; John Patrick Holland, Santa Clara, both of Calif.

[73] Assignee: Lam Research Corporation, Fremont, Calif.

[21] Appl. No.: 580,706

[22] Filed: Dec. 29, 1995

[51] Int. Cl.[6] .................................................. H03H 7/40
[52] U.S. Cl. ........................... 315/111.21; 315/111.51; 333/17.3
[58] Field of Search ................ 333/17.3, 32; 315/111.21, 315/111.41, 111.51, 111.61, 111.71

[56] References Cited

U.S. PATENT DOCUMENTS

| | | | |
|---|---|---|---|
| 3,995,237 | 11/1976 | Brunner | 333/17.3 |
| 4,375,051 | 2/1983 | Theall | 333/17.3 |
| 4,951,009 | 8/1990 | Collins | 333/17.3 |
| 5,187,454 | 2/1993 | Collins et al. | 333/17.3 |
| 5,383,019 | 1/1995 | Farrell et al. | 356/316 |
| 5,629,653 | 5/1997 | Stimson | 333/17.3 |

FOREIGN PATENT DOCUMENTS

| | | |
|---|---|---|
| 3903719 A1 | 2/1989 | Germany . |
| 59-221020 | 5/1983 | Japan . |
| 61139111 | 12/1984 | Japan . |

Primary Examiner—Robert Pascal
Assistant Examiner—David H. Vu
Attorney, Agent, or Firm—Lowe Hauptman Gopstein & Berner

[57] ABSTRACT

A load including a plasma discharge in a vacuum plasma processing chamber is matched to an r.f. source that supplies sufficient power to the discharge to maintain the discharge. A matching network connected between the source and a plasma excitation component of the chamber includes first and second variable reactances. A microprocessor causes the value of the first reactance to be varied while the value of the other reactance stays constant until power reflected from the load to output terminals of the source is minimized. The microprocessor causes the value of the second reactance to then be varied while the value of the first reactance stays constant until reflected power is minimized. The reactance values are alternately changed until the reflected minimum power does not change, at which time there is a match. To initiate the discharge, the microprocessor causes the value of the one reactance to change while the value of the other reactance stays constant.

23 Claims, 2 Drawing Sheets

APPARATUS FOR CONTROLLING MATCHING NETWORK OF A VACUUM PLASMA PROCESSOR AND MEMORY FOR SAME

FIELD OF THE INVENTION

The present invention relates generally to an apparatus for controlling a matching network of a vacuum plasma processing chamber and more particularly to such an apparatus wherein a first variable reactance of the network is maintained constant while a second variable reactance of the network is controlled until a function of measured reflected power at output terminals of an excitation source has a predetermined relation and then the second reactance is maintained constant while the first reactance is controlled until the function of measured, reflected power has the predetermined relation. A further aspect of the invention relates to an apparatus for controlling such a matching network during ignition of gaseous ions forming the plasma wherein a first variable reactance of the matching network is maintained constant while a second variable reactance of the matching network is varied until the plasma discharge is initiated. An additional aspect of the invention relates to a memory storing signals for such controls.

BACKGROUND ART

Vacuum plasma processing chambers are employed for processing workpieces, typically glass, semiconductor or metal substrates, so the workpiece is etched and/or has materials deposited thereon. Significant amounts of r.f. power must be supplied to the vacuum plasma processing chamber to excite ions in a gas in the chamber to a plasma and to maintain the plasma in a discharge state. The impedance of a load of the vacuum plasma processing chamber, including the plasma discharge and an excitation circuit component for it, usually a coil or one or more electrodes, varies non-linearly and unpredictably. For example, the quality factor (Q) of an excitation coil prior to ignition of the plasma is typically quite high, about 100–400. After ignition, the Q of the coil and its plasma load drops to about 10–20. As a power matched condition is approached, the Q of the coil and plasma drops to a lower value because the resistive impedance seen looking into a matching network driving the coil and the plasma becomes a larger percentage of the total admittance (i.e., the reciprocal of impedance) seen looking into the matching network. Properties of the plasma also cause the reactive impedance seen looking into the matching network to decrease as a power matched condition is approached and reached. The resistive impedance results, to a large extent, from the charged carriers in the plasma. Hence, matching to a plasma presents particular problems due to these variations in the resistive (real) and reactive (imaginary) impedance components of the load seen looking into the matching network driving the excitation circuit element and plasma of a vacuum plasma processing chamber.

The matching network is intended to (1) maximize power supplied to the load, for efficiency, and (2) minimize power reflected from the load to a relatively high power r.f. excitation source, for efficiency and prevention of possible source damage. The matching network is connected between the excitation circuit components and an output terminal of a relatively long cable (e.g. 13 feet) driven by the source. The source has a specified output impedance, such as 50 ohms resistive, and zero ohms reactive. The source output impedance equals the cable characteristic impedance. The matching network is supposed to match the impedance of the load to that of the source by (1) resonating the load impedance and (2) adjusting the resistive impedance seen by the source so it equals the source resistive impedance.

Typically, the matching network includes two variable reactances, one for primarily controlling the resistive impedance component seen looking into the matching network and a second for primarily controlling the reactive impedance component seen looking into the matching network. In one prior art arrangement, the variable reactances are automatically simultaneously adjusted in an attempt to minimize reflected power. The most commonly used technique for controlling the values of the variable reactances involves detecting the phase and magnitude of the impedance seen looking into the input terminals of the matching network. The reactance which primarily controls the reactive component is varied until the phase difference between the source output current and voltage is zero while the value of the reactance which primarily controls the resistive impedance component seen by the source is varied until it is as close as possible to the source output resistance. Positive and negative errors in the detected magnitude and phase cause the first and second reactances to be varied in opposite directions. However, because of ambiguity in the relation between the values of the matching network reactances and the phase and perhaps magnitude of the voltage and current derived by the source, the values of the variable impedances are sometimes driven in the wrong directions. If the values of the variable impedances are driven in the wrong directions, achieving a match is very difficult and may be impossible.

A further disadvantage of this prior art system is that the controller often becomes unstable so it cannot provide the correct values for the two variable reactances, to achieve the desired magnitude and phase values. In addition, the prior art system suffers from gain/loop control problems. These problems are particularly significant in matching networks connected between a relatively high power r.f. source for exciting and maintaining a plasma discharge of a vacuum plasma processing chamber and a load including the plasma discharge. This is because the discharge is subject to the unpredictable, non-linear impedance variations discussed supra. A further problem with the prior art is that the plasma discharge sometimes becomes so unstable in response to changes in the matching network reactances that the discharge is extinguished, with catastrophic effects on the processed workpiece.

It is, accordingly, an object of the present invention to provide a new and improved apparatus for controlling a matching network connected between an r.f. source having sufficient power to maintain a plasma discharge of a vacuum plasma discharge chamber and a load including the discharge.

Another object of the invention is to provide a new and improved apparatus for controlling a matching network connected between an r.f. power source and a load including a plasma discharge of a vacuum plasma processing chamber wherein the values of reactances of the controller are varied precisely, in a straightforward manner which assures accurate tracking of the unpredictable, non-linear characteristics of the plasma discharge impedance and prevents the plasma discharge from being extinguished.

An additional object of the invention is to provide a new and improved apparatus for controlling a matching network connected between an r.f. source and a load including a plasma discharge of a vacuum plasma processing chamber wherein reactance values of the matching network are controlled in such a manner that the matching network provides accurate resistive and reactive impedance matching.

A further object of the invention is to provide a new and improved apparatus for igniting gaseous ions of a vacuum plasma processing chamber into a plasma discharge by controlling a reactance of a matching network connected between an r.f. source and a load including an excitation circuit component of a vacuum plasma processing chamber.

An added object of the invention is to provide a new and improved memory storing signals for controlling impedances of a matching network connected between an r.f. excitation source and an excitation impedance of a plasma discharge of a plasma processing chamber.

SUMMARY OF THE INVENTION

In accordance with one aspect of the present invention, these and other objects of the invention are achieved by an apparatus for matching a load including a plasma discharge in a vacuum plasma processing chamber to an r.f. source that supplies sufficient power to the discharge to maintain the discharge, wherein first and second variable reactances of a matching network connected between the r.f. source and a plasma excitation component of the chamber are controlled by an apparatus for: (a) measuring a function of power reflected back to the source, (b) varying the value of the first reactance while the value of the second reactance is maintained constant until the function of the measured reflected power has a predetermined relation, and (c) then varying the value of the second reactance while the value of the first reactance is maintained constant until the function of the measured reflected power again has the predetermined relation. Usually, it is necessary to repeat steps (b) and (c) until there is no substantial change in the measured reflected power. In the preferred embodiment, the predetermined relation is a minimum value of measured reflected power. Because the reactances are sequentially controlled as a function of reflected power, that is in turn a function of the resistive and reactive impedance components seen looking into the matching network, the instability problems associated with simultaneously controlling two reactances are avoided.

According to another aspect of the invention, a plasma discharge in a vacuum plasma processing chamber is ignited by connecting an r.f. source to a plasma excitation component of the chamber via a matching network. The matching network includes first and second variable reactances that primarily respectively control the magnitude of the resistive and reactive components of the impedance seen looking from output terminals of the source. An apparatus varies the value of one of the reactances while the value of the other reactance is maintained constant. The reactance variation causes the power supplied to gaseous ions in the chamber to be varied in such a way as to cause plasma ignition. To facilitate operations, ignition is preferably, but not necessarily, controlled with the same device that provides reactance control while ignition is extant.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
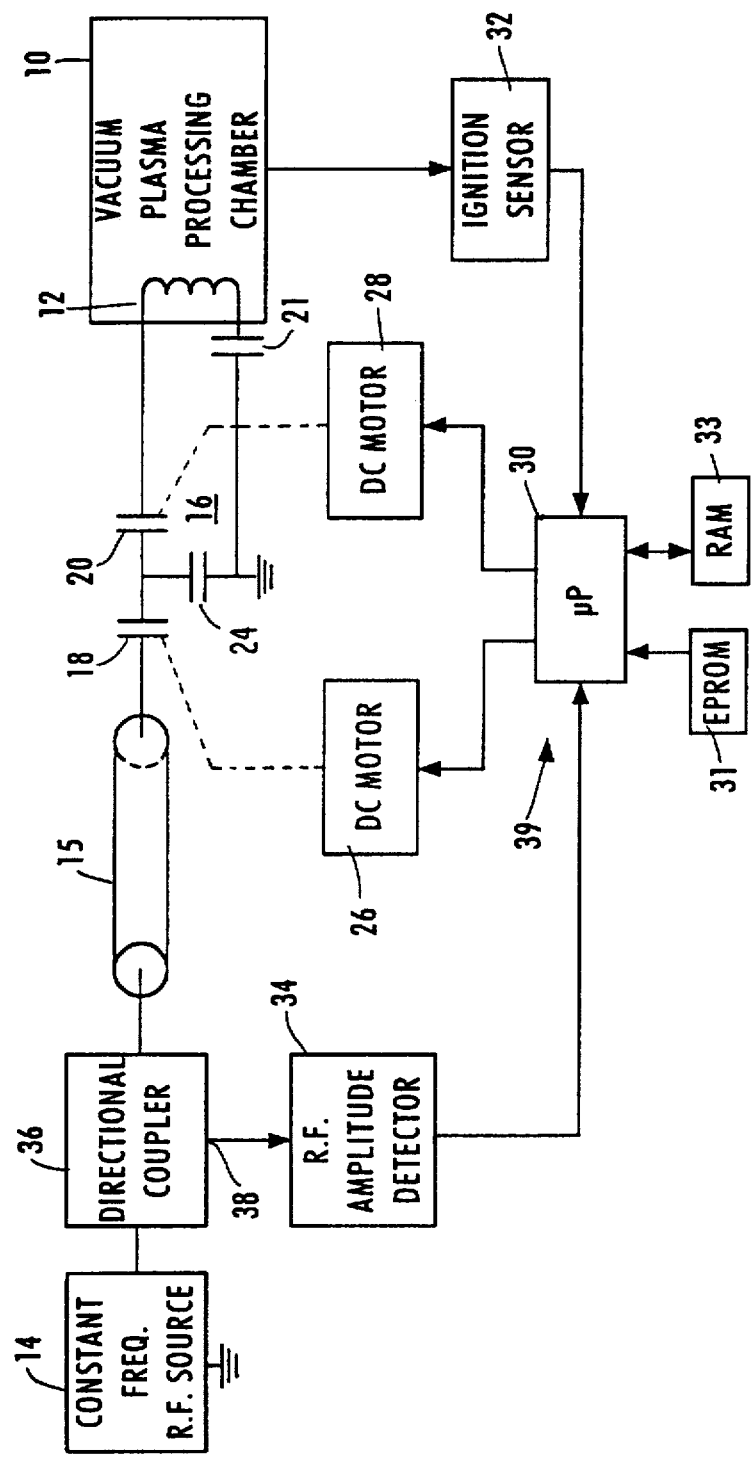
FIG. 1 is a block diagram of a preferred embodiment of the invention.

Reference is now made to FIG. 1 of the drawing, wherein vacuum plasma processing chamber 10 is illustrated as including excitation coil 12, connected to constant frequency (typically 13.56 mHz) r.f. source 14 by way of resonant matching network 16. Vacuum plasma processing chamber 10 is of conventional design, including a source of gaseous ions which are excited to and maintained in a plasma state by an r.f. electromagnetic field derived from coil 12. A workpiece, typically a glass, semiconductor or metal substrate (not shown) located in chamber 10 is processed by ions in the plasma discharge so the workpiece is etched and/or material is deposited thereon. The plasma discharge and coil 12 form a load for source 14 and resonant matching network 16. Source 14 is connected to network 16 by cable 15, usually having a relatively long length, e.g. 13 feet.

Source 14 has a resistive output impedance, e.g. 50 ohms, and usually a zero ohm reactive output impedance, i.e., the impedance seen looking into output terminals of source 14 is (50+j0) ohms. Cable 15 has a characteristic impedance at the frequency of source 14 equal to the output impedance of the source. Directional coupler 36, connected between the output terminals of source 14 and cable 15, includes output port 38 on which is derived an r.f. signal having an amplitude directly proportional to the r.f. power reflected by cable 15 to the output terminal of source 14. The signal at port 38 is supplied to r.f. amplitude detector 34 for deriving a DC signal directly proportional to the power reflected from cable 15 back to output terminals of the source. The plasma discharge in chamber 10 is subject to transient and nonlinear variations, which are reflected by matching network 16 and cable 15 to output terminals of constant frequency r.f. source 14. Impedances of matching network 16 are controlled to minimize the power reflected back to the output terminals of source 14 despite these variations.

In a preferred embodiment, matching network 16 is configured as a "T," having two series arms, respectively including variable series capacitors 18 and 20. Matching network 16 also includes fixed shunt capacitor 24, connected between a common terminal for capacitors 18 and 20 and ground. Fixed capacitor 22 is connected in series with coil 12, between the coil and the grounded electrode of capacitor 24. Capacitor 18 primarily controls the magnitude of the resistive impedance component seen looking into the input terminals of matching network 16 from source 14, while capacitor 20 primarily controls the magnitude of the reactive impedance seen looking into the matching network. Frequently, capacitors 18 and 20 are respectively referred to in the art as the load and tune reactances or capacitors.

The values of capacitors 18 and 20 are sequentially varied so the output impedance of source 14, usually 50 ohms resistive and zero ohms reactive, is matched to the impedance seen looking into the input terminals of cable 15, i.e. the cable terminals connected to the output terminals of source 14. In addition, the value of load capacitor 18 is maintained constant while the value of tune capacitor 20 is varied during a startup phase of vacuum plasma processing chamber 10 to cause the gaseous ions in the chamber to be excited into a plasma discharge.

To these ends, digital controller 39 includes microprocessor 30, programmable read only memory (EPROM) 31 and random access memory (RAM) 33. Memory 31 stores a program for controlling, inter alia, (1) flow of data signals from amplitude detector 34 and ignition sensor 32 to microprocessor 30, (2) computations and other operations performed by the microprocessor, (3) the flow of signals from the microprocessor to DC motors 26 and 28 that respectively control the values of capacitors 18 and 20, and (4) the flow of signals between RAM 33 and microprocessor 30. Microprocessor 30 includes a digital to analog converter for deriving bi-directional DC signals for controlling the speed and direction of output shafts of motors 26 and 28. Ignition sensor 32 is preferably an optical spectrometer responsive to optical properties of the plasma discharge in chamber 10. Microprocessor 30 responds to the output of ignition sensor 32 to derive a flag indicating whether a discharge exists or does not exist in chamber 10. In addition, microprocessor 30 includes an analog to digital converter responsive to the DC output signal of amplitude detector 34, indicative of the r.f. power reflected by cable 15 back to source 14.

When the load including coil 12 and the discharge of chamber 10 is impedance matched by network 16 to the output impedance of cable 15 and r.f. source 14 there is no reflected power coupled by cable 15 to the output terminals of source 14. The output of amplitude detector 34 supplied to microprocessor 30 has a minimum value when capacitors 18 and 20 are adjusted to cause a match. Amplitude detector 34 derives a DC output signal which is converted into a digital signal by the analog to digital converter in microprocessor 30.

In one preferred embodiment, memory 31 is programmed so microprocessor 30 derives DC output signals having only zero or fixed positive and negative values so motors 26 and 28 are stationary or are sequentially driven in opposite directions at constant speed so motor 26 is energized while motor 28 is stationary and vice versa. The motors are driven until reflected power, as indicated by the output of detector 34, is minimized. In a second embodiment, memory 31 is programmed so microprocessor 30 functions as a digital proportional-integral controller responsive to the amplitude of the reflected power, as determined by the amplitude of the output of detector 34. The proportional-integral controller sequentially derives two variable amplitude, bi-directional output signals, each having a magnitude and polarity for respectively controlling the speed and direction of the shafts of DC motors 26 and 28. The motor speeds decrease as the reflected power decreases, i.e., the speeds of motors 26 and 28 are greatest at greatest mismatch and decrease as matching is approached, as indicated by the decreasing amplitude of the output of detector 34. Hence, memory 31 activates microprocessor 30 to drive motor 26 while maintaining motor 28 stationary until the output of detector 34 is minimized; then memory 31 activates microprocessor 30 to drive motor 28 while maintaining motor 26 stationary until the output of detector 34 is again at a minimum. Microprocessor 30 continues this process until the output of detector 34 is zero or cannot be reduced further. In a typical situation wherein desired load power is 300 watts, the reflected power is reduced to less than one watt.

Figure 2:
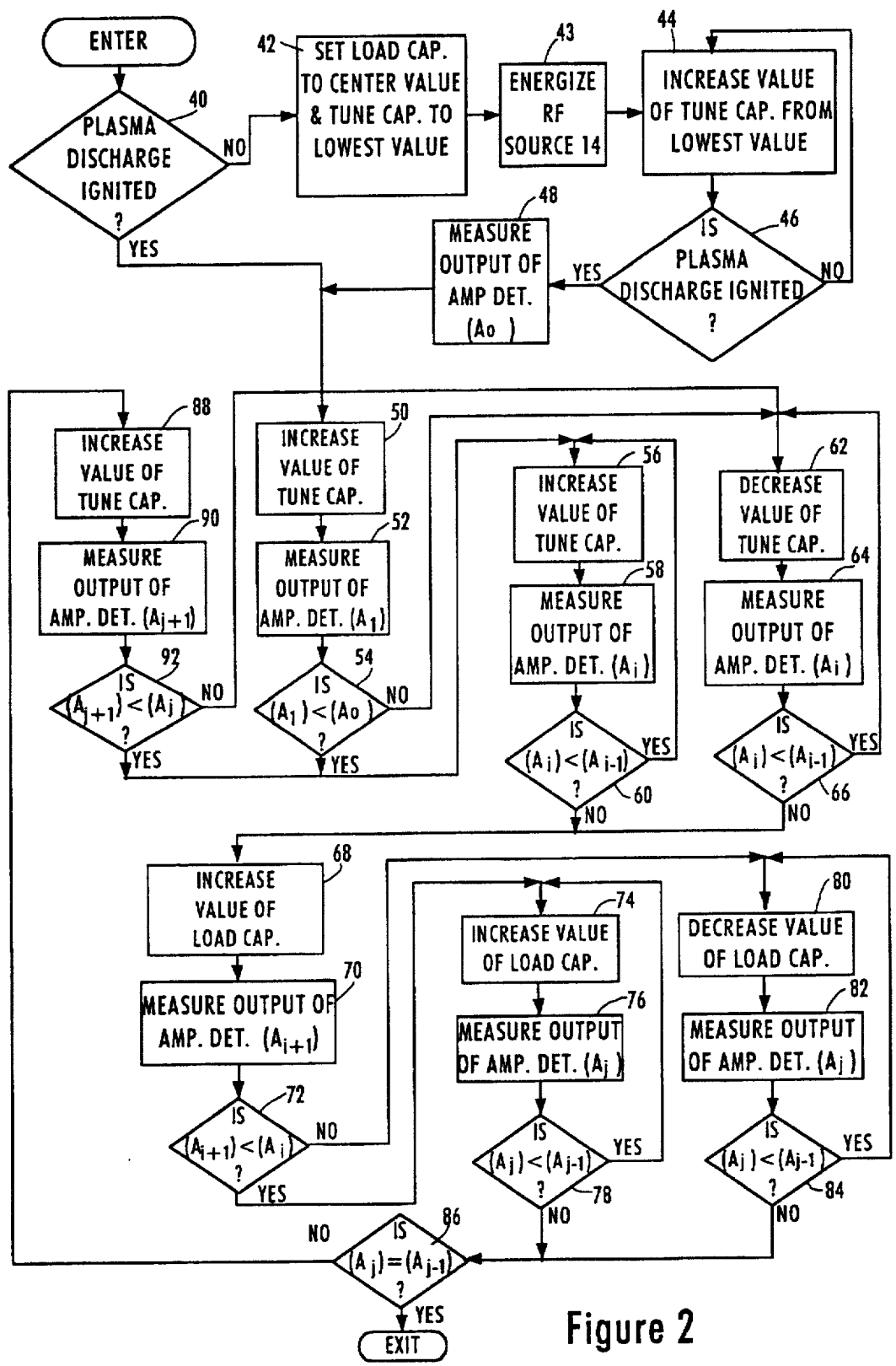
FIG. 2 is a flow diagram of a control program included in a microprocessor of FIG. 1.

During the ignition phase, memory 31 activates microprocessor 30 to initially drive DC motor 26 so capacitor 18 is at a nominal value, usually toward the center of its range of values, determined by historical data stored in memory 33 and indicative of the value of capacitor 18 where ignition is likely to take place. Memory 31 causes microprocessor 30 to perform this step if the plasma discharge is not ignited, as indicated by program step 40 (FIG. 2) of memory 31 for controlling microprocessor 30. Control of capacitor 18 is during step 42, at which time motor 26 is driven by a fixed DC output of a first polarity of microprocessor 30 such that capacitor 18 is at one extreme value in its range. Microprocessor 30 then responds to memory 31 to supply a fixed DC output of a second polarity to motor 26 to drive capacitor 18 to the nominal value. After microprocessor 30 drives capacitor 18 to its nominal value, memory 31 activates the microprocessor to supply a fixed DC voltage of a first polarity to DC motor 28, to drive capacitor 22 to one end value in its range. R.f. source 14 is then energized during operation 43 while gaseous ions are supplied to vacuum plasma processing chamber 10. Memory 31 then, during operation 44, activates microprocessor 30 to supply a fixed DC voltage of the second polarity to motor 28, to change the value of capacitor 20 from its end value toward its center value. As microprocessor 30 is effectively driving capacitor 20 toward its center value, the microprocessor responds, during operation 46, to the output of ignition sensor 32 to determine if the discharge has been established in chamber 10. When microprocessor 30 determines from sensor 32 that ignition of the plasma in chamber 10 has occurred (operation 46), microprocessor 30 reduces to zero the DC voltage supplied to motor 26 and capacitor 18 is maintained at the capacitive value which caused ignition to occur.

After sensor 32 and microprocessor 30 detect ignition of the plasma discharge in chamber 10, memory 31 activates microprocessor 30 to control the values of capacitors 18 and 20 to achieve an impedance match between the output of source 14 and the impedance seen looking from the source into the input terminals of cable 15. In general, such matching is performed by microprocessor 30 initially maintaining capacitor 18 at a fixed value while the microprocessor varies the value of capacitor 20 until the power reflected from cable 15 to source 14 is minimized, as determined by the microprocessor and RAM 33 detecting a minimum amplitude output signal of amplitude detector 34. Then microprocessor 30 maintains the value of capacitor 20 constant while varying the value of capacitor 18 until the reflected power at the input terminals of matching network 16 is minimized, as indicated by a minimum amplitude output of amplitude detector 34. Then microprocessor 30 again changes the value of capacitor 20 while maintaining the value of capacitor 18 constant. These operations are continued in sequence until the reflected power at the output terminals of source 14 has a minimum value.

When operation 46 of microprocessor 30 indicates the gaseous ions in chamber 10 have been ignited and the plasma discharge has been established, the output of amplitude detector 34 is detected to provide a value $A_0$, as indicated by operation 48. The value of $A_0$ is stored in a designated address of RAM 33. Operation 48 is the first operation involved in controlling variable capacitors 18 and 20 of matching network 16 to achieve matching between the output impedance of r.f. source 14 and the impedance seen looking into cable 15.

Microprocessor 30 then advances its program in EPROM 31 to operation 50, when the microprocessor supplies a constant DC voltage of the first polarity to motor 28, to change the value of capacitor 20 in a first direction, e.g. to increase the value of capacitor 20. Then the program advances to operation 52 when the output of amplitude detector 34 is again monitored by the microprocessor, which supplies the output of the detector to RAM 33 as value $A_1$. Then microprocessor 30 is controlled by the program of EPROM 31 to compare, during operation 54, the most recent value of the output of detector 34 ($A_1$) with the initial stored value of the output of detector 34 ($A_0$). If, during operation 54. microprocessor 30 determines that the value of $A_1$ is less than the value of $A_0$, to indicate there is now a closer match between the output impedance of source 14 and the input impedance of cable 15 than existed prior to the value of capacitor 20 being increased, the microprocessor program advances to operation 56. During operation 56, microprocessor 30 continues to supply the first polarity DC voltage to motor 28, to continue to drive the value of capacitor 20 in the first direction. The DC voltage supplied to motor 28 can be fixed or variable, as a function of the amplitude of reflected power, as indicated by the output of detector 34.

After operation 56 has been completed, microprocessor 30 again responds, during operation 58, to a digital signal indicative of the most recent output of amplitude detector 34 ($A_i$). Microprocessor 30 then determines, during operation 60, whether the most recent measurement from amplitude detector 34 ($A_i$) is less than the previous measurement from the amplitude detector ($A_{i-1}$). In response to operation 60 indicating $A_i$ does not exceed $A_{i-1}$, steps 56, 58 and 60 are repeated until $A_i$ is detected during operation 60 as being greater than $A_{i-1}$.

If microprocessor 30 indicates, during operation 54, that $A_1$ (the output of amplitude detector 34 derived after the first step change of capacitor 20) is greater than $A_0$ (the initial output of the amplitude detector determined prior to the first step change in capacitor 20), the microprocessor performs operation 62. During operation 62, microprocessor 31 decreases the value of capacitor 20 by driving motor 28 in a direction opposite from the direction that caused the value of capacitor 20 to be changed during step 56. After step 62 has been performed, microprocessor 30 performs steps 64 and 66, corresponding with steps 58 and 60. Microprocessor 31 repeats steps 62, 64 and 66 until it determines during step 66 that $A_i$ is greater than $A_{i-1}$.

In response to microprocessor 30 indicating, during operation 60 or 66, that the most recent output of amplitude detector 34 is greater than the immediately prior output of amplitude detector 34, i.e., $A_i$ is greater than $A_{i-1}$, the microprocessor effectively derives a signal indicating that capacitor 20 has been driven to a value causing the reflected power to the input terminals of matching network 16 to be temporarily minimized. Microprocessor 30 then maintains capacitor 20 at a constant value and causes the value of capacitor 18 to be varied until the reflected power at the input terminals of matching network 16 is again minimized.

To these ends, the program of microprocessor 30 advances to operation 68. During operation 68 microprocessor 30 supplies motor 26 with a voltage having a first polarity and magnitude, which causes the value of capacitor 18 to increase in a first direction. Microprocessor 30 then, during operation 70, monitors the output of amplitude detector 34 as $A_{i+1}$. Microprocessor 30 then determines, during operation 72, whether the most recent measurement of the output of detector 34 ($A_{i+1}$) is less than the immediately preceding output of the detector, $A_i$. In response to operation 72 indicating that $A_{i+1}$ does not exceed $A_i$, the program of EPROM 31 proceeds to operation 74, causing microprocessor 30 to continue to supply a DC voltage of the first polarity and magnitude to motor 26. Thereby, microprocessor 30 derives a signal so the value of capacitor 18 continues to be driven in the same direction that the value of the capacitor was driven during operation 68. After the value of capacitor 18 has been changed during operation 74, the output of amplitude detector 34 is again measured as $A_j$ during operation 76. Microprocessor 30 then responds to program signals of EPROM 31 to advance to operation 78, causing the microprocessor to compare the value of $A_j$ with the value of the previously detected output of detector 34, $A_{j-1}$. In response to microprocessor 30 detecting that $A_j$ does not exceed $A_{j-1}$, operations 74, 76 and 78 are repeated until the microprocessor, during operation 78, determines $A_j$ is greater than $A_{j-1}$.

If operation 72 indicates $A_{i+1}$ is greater than $A_i$, the program advances to step 80 instead of to step 74. In step 80, microprocessor 30 derives a signal to decrease the value of capacitor 18, i.e., microprocessor 30 causes the value of capacitor 18 to change in a direction opposite from the direction the value of capacitor 18 was changed during operation 68. After operation 80 has been performed, microprocessor 30 performs operations 82 and 84, corresponding with operations 76 and 78. In response to microprocessor 30 detecting, during operation 84, that $A_j$ does not exceed $A_{j-1}$, the microprocessor repeats operations 80, 82 and 84 until the microprocessor detects, during operation 84, that $A_j$ is greater than $A_{j-1}$.

In response to microprocessor 30 determining during operation 78 or 84 that $A_j$ is greater than $A_{j-1}$, the microprocessor stops changing the value of capacitor 18. Thereafter, microprocessor 30 responds to the output of detector 34 and signals in RAM 33 to determine whether the reflected power seen looking into cable 15 is a minimum. If the reflected power is a minimum, microprocessor 30 makes no further changes in the values of capacitors 18 and 20. If, however, the reflected power looking into cable 15 is not a minimum, the process is repeated, such that microprocessor 30 changes the value of capacitor 20 while maintaining the value of capacitor 18 constant, until a minimum reflected impedance is detected at the input terminals of cable 15. Then microprocessor 30 causes the value of capacitor 18 to change while preventing the changes in the value of capacitor 20.

To these ends, after operation 78 or 84, whichever is performed, has been completed, microprocessor 30 performs operation 86. During operation 86 microprocessor 30 determines whether $A_j = A_{j-1}$. In response to $A_j$ differing from $A_{j-1}$, i.e., the most recent output of amplitude detector 34 not being equal to the output of the amplitude detector during the immediately preceding sampling instant, the program of microprocessor 30 progresses to step 88. During step 88, microprocessor 30 again causes the value of capacitor 20 to increase by supplying motor 28 with a fixed DC voltage of the first polarity. Then the program advances to operation 90, during which microprocessor 30 again measures the output of amplitude detector 34, $A_{j+1}$. Microprocessor 30 then determines during operation 92 whether the most recent detected value of the output of amplitude detector 34 ($A_{j+1}$) does not exceed the immediately preceding detected output of detector 34 ($A_j$).

Operation 92 is thus very similar to operation 54. The "yes" and "no" responses microprocessor 30 derives as a result of operation 92 respectively cause an increase and a decrease in the value of capacitor 20 during operations 56 and 62. Microprocessor 30 then continuously repeats the remainder of the previously described sequence until the microprocessor, during operation 86, determines that $A_j = A_{j-1}$.

When microprocessor 30 determines, during operation 86, that $A_j = A_{j-1}$, the reflected power at the output terminals of source 14 is a minimum and microprocessor 30 exits the program for controlling motors 26 and 28 and the values of capacitors 18 and 20. Microprocessor 30 periodically re-enters the program of FIG. 2 under the control of memory 31 to determine if the plasma discharge is ignited and if the values of capacitor 18 and/or capacitor 20 must be changed.

While there has been described and illustrated one specific embodiment of the invention, it will be clear that variations in the details of the embodiment specifically illustrated and described may be made without departing from the true spirit and scope of the invention as defined in the appended claims. For example, the invention is not limited to exciting the plasma with coil 12. Electrodes can be used to excite the plasma. If electrodes are used to excite the coil, the matching network is generally configured as an "L" including a fixed inductor in a series branch between the exciting electrodes and a variable tune capacitor, connected to a shunt variable load capacitor. The values of the capacitors are varied to achieve matching in much the same way that the values of capacitors 18 and 20 are varied, i.e., in response to a function of reflected power. At match, the values of the capacitors are such that the reflected power is minimized.

We claim:

1. Apparatus for matching a load including a plasma discharge in a vacuum plasma processing chamber to an r.f. source for supplying sufficient power to the discharge to maintain the discharge, the apparatus operating with a matching network connected between the r.f. source and a plasma excitation component of the chamber, the matching network including first and second variable reactances, the apparatus comprising
   (a) means for measuring a function of power reflected from the load and the matching network back to the source,
   (b) means for varying the value of the first reactance while the value of the second reactance is maintained constant until the function of the measured power reflected from the load including the discharge has a predetermined relationship, and
   (c) means responsive to the function of the measured power reflected from the load including the discharge having the predetermined relationship for then varying the value of the second reactance while the value of the first reactance is maintained constant until the function of the measured power reflected from the load including the discharge has the predetermined relationship.

2. Apparatus for matching a load including a plasma discharge in a vacuum plasma processing chamber to an r.f. source for supplying sufficient power to the discharge to maintain the discharge, the apparatus operating with a matching network connected between the r.f. source and a plasma excitation component of the chamber the matching network including first and second variable reactances, the apparatus comprising
   (a) means for measuring a function of power reflected from the load and the matching network back to the source,
   (b) means for varying the value of the first reactance while the value of the second reactance is maintained constant until the function of the measured reflected power has a predetermined relationship, and
   (c) means responsive to the function of the measured reflected power having the predetermined relationship for then varying the value of the second reactance while the value of the first reactance is maintained constant until the function of the measured reflected power has the predetermined relationship, the apparatus being arranged to repeat steps (a) and (b) until there is no substantial change in the function of the measured reflected powers whereby the source is substantially impedance matched to the load.

3. The apparatus of claim 2 wherein the function is the value of reflected power and the apparatus is arranged to repeat steps (a) and (b) until the reflected power has a minimum value.

4. Apparatus for igniting gaseous ions that are not in a plasma state in a vacuum plasma processing chamber into a plasma discharge with an r.f. source connected to a plasma excitation component of the chamber via a matching network including first and second variable reactances for primarily respectively controlling the magnitude of a resistive impedance component seen by looking into the matching network and the reactive impedance component seen by looking into the matching network, the apparatus comprising a controller for varying the value of the second reactance and for maintaining the value of the first reactance constant while the gaseous ions are not in a plasma state, the controller varying only the second reactance until the gaseous ions in the chamber are ignited to form the plasma discharge.

5. The apparatus of claim 4 wherein the controller maintains the first reactance at a constant value in a center portion of a range of the first reactance.

6. The apparatus of claim 4 wherein the controller maintains the first reactance at a constant value where ignition in the chamber has occurred previously.

7. The apparatus of claim 4 further comprising means for matching a load including the ignited plasma discharge to the source, said matching means including means for:
   (a) measuring a function of power reflected from the load and the matching network back to the source,
   (b) varying the value of the first reactance while the value of the second reactance is maintained constant until the function of the measured reflected power has a predetermined relationship, and
   (c) then, in response to the function of the measured reflected power having the predetermined relationship, varying the value of the second reactance while the value of the first reactance is maintained constant until the function of the measured reflected power has the predetermined relationship.

8. The apparatus of claim 7 wherein (a) and (b) are repeated until there is no substantial change in the function of the measured reflected power.

9. The apparatus of claim 7 wherein (a) and (b) are repeated until there is no substantial change in the reflected power and the reflected power has a minimum value.

10. Apparatus for matching a load including a plasma discharge in a vacuum plasma processing chamber to an r.f. source that supplies sufficient power to the discharge to maintain the discharge, comprising:
   a matching network connected between the r.f. source and a plasma excitation component of the chamber, the matching network including first and second variable reactances,
   a detector for a function of power reflected from a load including the discharge to output terminals of the source,
   a controller responsive to the detector for:
   (a) varying the value of the first reactance while the value of the second reactance is maintained constant until the function of the measured power reflected from the load including the discharge has a predetermined relationship, and
   (b) then, in response to the function of the measured power reflected from the load including the discharge having the predetermined relationship, varying the value of the second reactance while the value of the first reactance is maintained constant until the function of the measured power reflected from the load including the discharge has the predetermined relationship.

11. The apparatus of claim 10 wherein the controller sequentially varies the values of only the first reactance and then of only the second reactance until there is no substantial change in the power reflected from the load including the discharge and the power reflected from the load including the discharge is minimized.

12. The apparatus of claim 10 wherein the controller sequentially varies the values of only the first reactance and then of only the second reactance until there is no substantial change in the function of power reflected from the load including the discharge.

13. Apparatus for igniting gaseous ions that are not in a plasma state in a vacuum plasma processing chamber into a plasma discharge with an r.f. source connected to a plasma excitation component of the chamber, comprising a matching network including first and second variable reactances for primarily respectively controlling the magnitude of a resistive impedance component seen by looking into the matching network and the reactive impedance component seen by looking into the matching network, a signal source for deriving a signal indicating the presence and absence of ignition of the plasma in the chamber, and a controller responsive to the signal source for varying the value of the second reactance while the value of the first reactance is maintained constant while the signal source indicates the gaseous ions are not in an ignited plasma state, the controller varying only the second reactance until the plasma discharge is indicated by the signal source as being present.

14. The apparatus of claim 13 wherein the controller maintains the first reactance at a constant value in a center portion of a range thereof.

15. The apparatus of claim 13 wherein the matching network is arranged for matching a load including the ignited plasma to the source.

16. The apparatus of claim 15 wherein the matching network is responsive to the controller and a detector for the power reflected from the load to output terminals of the source, the matching network being connected between the source and load, the controller responding to the detector for reflected power for:

(a) varying the value of the first reactance while the value of the second reactance is maintained constant until a function of the detected power reflected from the load including the discharge has a predetermined relation, and (b) then, in response to the function of the detected power reflected from the load including the discharge having the predetermined relation, varying the value of the second reactance while the value of the first reactance is maintained constant until the function of the detected power reflected from the load including the discharge has the predetermined relation.

17. The apparatus of claim 16 wherein the controller sequentially varies the values of the first and second reactances until there is no substantial change in the detected reflected power.

18. The apparatus of claim 16 wherein the controller sequentially varies the values of the first and second reactances until there is no substantial change in the detected reflected power.

19. The apparatus of claim 15 wherein the matching network is responsive to the controller and a detector for the power reflected from the load to the source, the matching network being connected between the source and load, the controller responding to the detector for reflected power for:

(a) varying the value of the first reactance while the value of the second reactance is maintained constant until the detected reflected power is minimized, and (b) then, in response to the detected power reflected from the load including the discharge being minimized, varying the value of the second reactance while the value of the first reactance is maintained constant until the detected power reflected from the load including the discharge is minimized.

20. The apparatus of claim 13 wherein the signal source includes a detector responsive to the presence of the plasma in the chamber.

21. A memory for use in a digital controller for first and second reactances of a matching network responsive to an r.f. source, the matching network being connected to drive an excitation component for a plasma discharge of a vacuum plasma processing chamber, the controller being responsive to a signal that is a function of power reflected from the load including the discharge, the memory comprising elements storing signals for commanding the controller to (a) vary the value of the first reactance while the value of the second reactance is maintained constant until a function of the detected power reflected from the load including the discharge has a predetermined relation, and (b) then, in response to the function of the detected power reflected from the load including the discharge having the predetermined relation, vary the value of the second reactance while the value of the first reactance is maintained constant until the function of the detected power reflected from the load including the discharge has the predetermined relation.

22. The memory of claim 21 wherein the controller is responsive to a signal indicating the presence and absence of ignition of the plasma in the chamber, the memory storing signals for controlling the controller to (a) vary the value of the second reactance and to maintain the value of the first reactance constant while the ignition indicating signal indicates the absence of ignition of the plasma, and (b) vary the value of the first reactance only while the ignition indicating signal indicates the presence of ignition of the plasma in the chamber.

23. A memory for use in a digital controller for at least one reactance of a matching network responsive to an r.f. source, the matching network being connected to drive an excitation component for a plasma discharge of a vacuum plasma processing chamber, the controller being responsive to a signal indicating the presence and absence of ignition of the plasma in the chamber, the memory comprising elements storing signals for commanding the controller to (a) vary the value of the second reactance and to maintain the value of the first reactance constant while the ignition indicating signal indicates the absence of ignition of the plasma, and (b) vary the value of the first reactance only while the ignition indicating signal indicates the presence of ignition of the plasma in the chamber.

* * * * *